United States Patent
Chiu et al.

(10) Patent No.: US 9,330,218 B1
(45) Date of Patent: May 3, 2016

(54) INTEGRATED CIRCUITS HAVING INPUT-OUTPUT CIRCUITS WITH DEDICATED MEMORY CONTROLLER CIRCUITRY

(71) Applicant: Altera Corporation, San Jose, CA (US)

(72) Inventors: Gordon Raymond Chiu, North York (CA); Sean Shau-Tu Lu, San Jose, CA (US); Warren Trent Nordyke, Cupertino, CA (US); Bonnie I. Wang, Cupertino, CA (US); Weizhong Xu, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/473,978

(22) Filed: Aug. 29, 2014

Related U.S. Application Data

(60) Provisional application No. 61/873,268, filed on Sep. 3, 2013.

(51) Int. Cl.
*G11C 5/06* (2006.01)
*G06F 17/50* (2006.01)
*G11C 7/10* (2006.01)
*G11C 7/22* (2006.01)

(52) U.S. Cl.
CPC ........ *G06F 17/5059* (2013.01); *G06F 17/5077* (2013.01); *G11C 5/06* (2013.01); *G11C 7/10* (2013.01); *G11C 7/22* (2013.01)

(58) Field of Classification Search
CPC ............... G11C 2029/0401; G11C 2029/0411; G11C 2029/4402; G11C 29/006; G11C 29/08; G11C 29/48; G11C 29/76; G11C 29/808; G11C 29/81; G11C 29/832; G11C 29/88; G11C 5/04
USPC ........ 365/189.05, 230.08, 185.08, 196, 210.1
See application file for complete search history.

(56) References Cited

U.S. PATENT DOCUMENTS

| | | | |
|---|---|---|---|
| 5,887,187 A | 3/1999 | Rostoker et al. | |
| 7,114,041 B2 | 9/2006 | Hammitt et al. | |
| 7,793,008 B2 | 9/2010 | Hammitt et al. | |
| 8,467,218 B1 | 6/2013 | Atsatt et al. | |
| 2007/0143640 A1* | 6/2007 | Simeral | G06F 1/28 713/320 |

* cited by examiner

*Primary Examiner* — Thong Q Le
(74) *Attorney, Agent, or Firm* — Treyz Law Group, P.C.; Jason Tsai

(57) ABSTRACT

An integrated circuit such as a programmable integrated circuit may include input-output circuits each having respective memory controller circuitry. The memory controller circuitry of the input-output circuits may be electrically coupled via a backbone path and configured to collectively form a memory controller. Each memory controller circuitry may include a protocol control circuit and input-output lanes. Memory access requests from on-chip circuitry may be provided to only a selected input-output circuit. The protocol control circuit of the selected input-output circuit may receive the memory access requests and generate memory control signals and local control signals from the memory access requests. The memory control signals may be provided to external memory. The local control signals may be provided to input-output circuits over the backbone path and synchronize the input-output circuits in conveying data between the integrated circuit and the external memory.

18 Claims, 10 Drawing Sheets

INTEGRATED CIRCUITS HAVING INPUT-OUTPUT CIRCUITS WITH DEDICATED MEMORY CONTROLLER CIRCUITRY

This application claims the benefit of and claims priority to provisional patent application No. 61/873,268, filed Sep. 3, 2013, which is hereby incorporated by reference herein in its entirety.

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices).

With each new generation of transistor technology, memory circuits are becoming operated at ever-increasing speeds. However, programmable integrated circuits have been unable to match the increases in clock speeds of memory circuits. For example, double-data-rate random access memory three (DDR3) and double-data-rate random access memory four (DDR4) can operate at speeds of 800 MHz and 1600 MHz, whereas programmable integrated circuits may operate at reduced speeds of about 200-400 Mhz.

In some scenarios, programmable integrated circuits have been provided with dedicated memory controllers that interface with memory circuits. The dedicated memory controllers are not programmable and are therefore capable of operating at speeds comparable to the memory circuits. However, dedicated memory controllers used in conventional programmable integrated circuits require dedicated routing paths for conveying data between the dedicated memory controllers and other circuitry on the programmable integrated circuits. These dedicated routing paths can occupy a disproportionate amount of the limited circuit area available on the programmable integrated circuit (e.g., area that then cannot be used for other circuitry). For example, the area occupied by dedicated routing paths can be 3-5% or more of the available area on a programmable integrated circuit.

In some scenarios, programmable integrated circuits are provided with modular physical interfaces (i.e., signal driver circuitry) that can be stitched together for use with a programmable memory controller (i.e., a memory controller implemented using programmable logic and sometimes referred to as a soft memory controller). However, the soft memory controller is incapable of operating at speeds comparable to memory circuit speeds, because the soft memory controller is implemented using programmable logic.

SUMMARY

An integrated circuit such as a programmable integrated circuit may include input-output circuits that are coupled to respective sets of input-output pins. The input-output circuits may each include respective memory controller circuitry. The memory controller circuitry of the input-output circuits may be electrically coupled via a backbone path. The input-output circuits may be configured to collectively form a memory controller that fulfills memory access requests provided by circuitry on the integrated circuit.

Each memory controller circuitry may include a protocol control circuit and input-output lanes that are coupled to respective sets of the input-output pins. Each input-output lane may be configured as a control lane that handles memory control signals or as a data lane that handles data signals. Memory access requests may be provided to only a selected input-output circuit. The protocol control circuit of the selected input-output circuit may receive the memory access requests and generate memory control signals and local control signals from the memory access requests. The backbone path may convey the local control signals to each data lane that is coupled to the external memory. The memory control signals may be provided to external memory over control lanes. The local control signals may synchronize the data lanes in conveying data between the integrated circuit and the external memory.

Further features of the present invention, its nature and various advantages will be more apparent from the accompanying drawings and the following detailed description.

DETAILED DESCRIPTION

Embodiments of the present invention relate to integrated circuits having memory controller circuitry. The memory controller circuitry may be used to control and interface with memory (e.g., external memory) such as random-access memory (RAM). The integrated circuits may be digital signal processors, microprocessors, application specific integrated circuits, or other suitable integrated circuits. These types of integrated circuits that are operable to communicate with system memory can benefit from improved memory controller circuitry designs.

Figure 1:
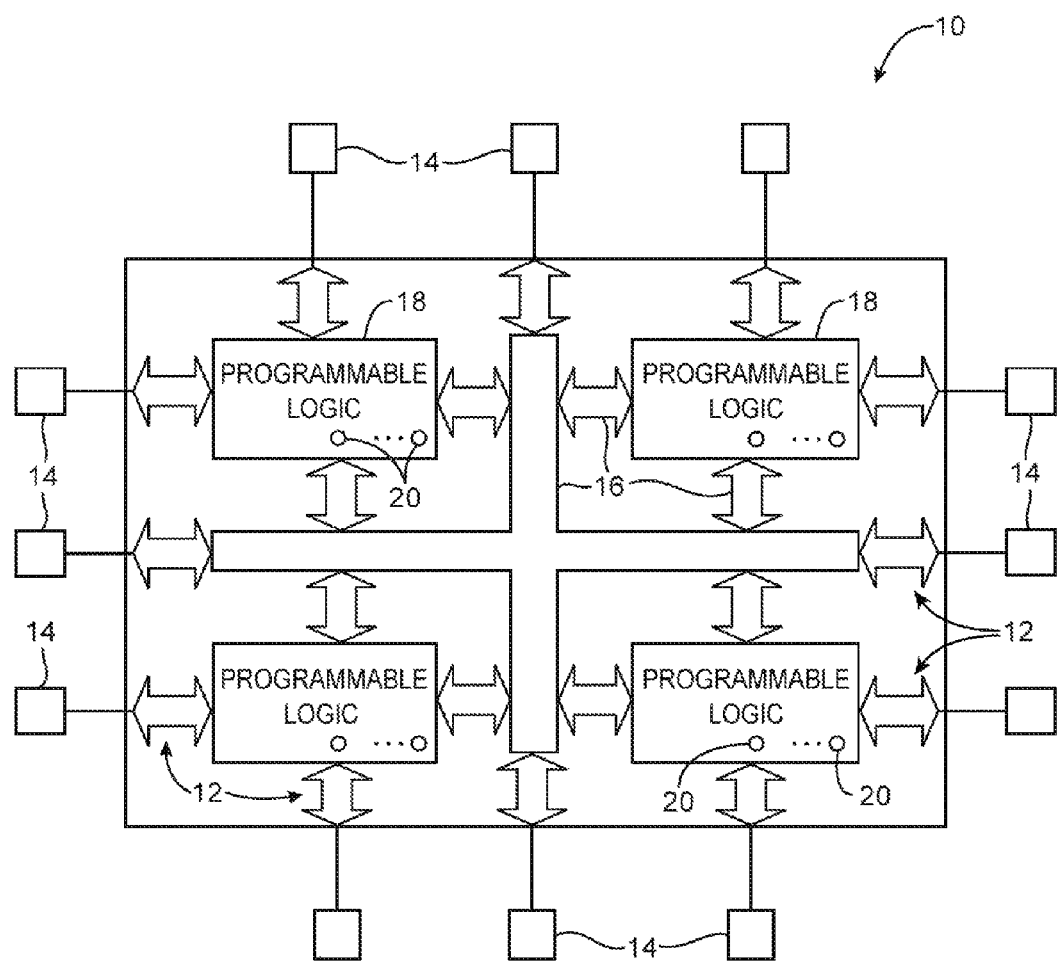
FIG. 1 is a diagram of an illustrative programmable integrated circuit that may include input-output circuits with dedicated memory controller circuitry in accordance with an embodiment of the present invention.

As an example, an integrated circuit such as a programmable integrated circuit may include memory controller circuitry. This is merely illustrative and does not serve to limit the scope of the present invention. If desired, application specific integrated circuits, microprocessors, and other application specific standard products may contain memory interface circuitry. FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. If desired, programmable logic 18 may include complex circuitry such as digital signal processors (DSPs) or random access memory (RAM). The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are often applied to gates of metal-oxide-semiconductor (MOS) transistors (sometimes referred to as pass gate transistors). This example is merely illustrative. If desired, programmable elements 20 may be used to provide static output signals for configuring any desired circuitry on device 10.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
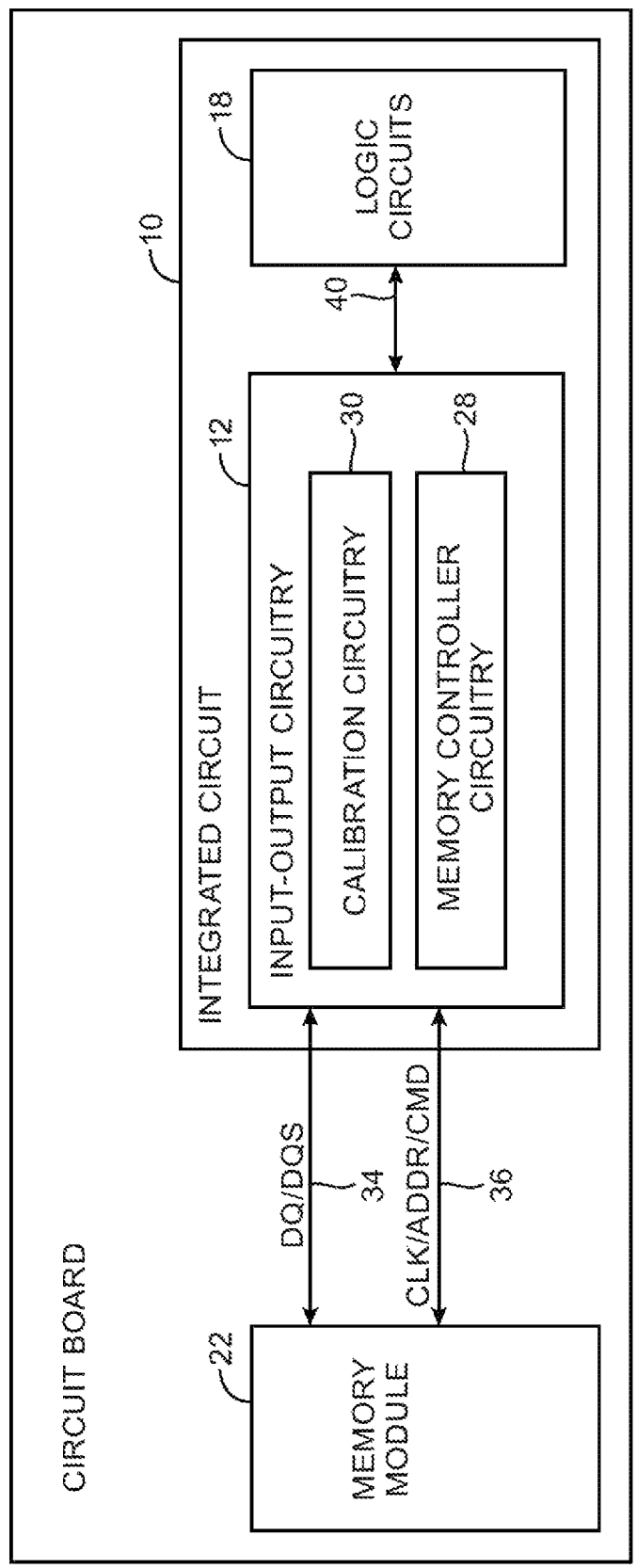
FIG. 2 is a diagram of an illustrative integrated circuit having memory controller circuitry operable to communicate with an external memory module in accordance with an embodiment of the present invention.

Device 10 may communicate with memory such as memory module 22 as shown in FIG. 2. Memory module 22 may be a memory device sometimes referred to as a single in-line memory module (SIMM) or a dual in-line memory module (DIMM). Device 10 may be configured to communicate with at least two memory modules 22, at least four memory modules 22, etc. The example of FIG. 2 in which memory 22 is a memory module is merely illustrative. If desired, memory 22 may be formed from individual memory components.

In the example of FIG. 2, integrated circuit 10, memory module 22, and other circuit components (e.g., integrated circuit chips, surface mount components, etc.) may be mounted on a circuit board 50. Circuit board 50 may, for example, be a rigid printed circuit board (PCB) or other suitable types of printed circuit substrates. Board components may be interconnected through conductive traces and packaging (e.g., sockets into which integrated circuits are mounted) formed on board 50. The example of FIG. 2 in which integrated circuit 10 and memory module 22 are formed as separate components on circuit board 50 is merely illustrative. If desired, integrated circuit 10 and memory module 22 may be formed together as a single component or a single package that may be mounted on circuit board 50. For example, integrated circuit 10 and memory module 22 may be formed as respective integrated circuit die that are stacked to form a single integrated circuit, which may be sometimes referred to as a 3D integrated circuit. In this scenario, paths such as paths 34 and 36 between the integrated circuit die may be formed from through-silicon vias that interconnect integrated circuit 10 and memory module 22 (e.g., vias through a silicon substrate of integrated circuit 10 or memory module 22). As another example, integrated circuit 10 and memory module 22 may each be coupled to an interposer (e.g., to a top surface of the interposer). In this scenario, the interposer may include a substrate and traces on the substrate may form paths 34 and 36 between integrated circuit 10 and memory module 22. The interposer may be mounted to circuit board 50 Arrangements in which two or more integrated circuit die are coupled to an interposer may be sometimes be referred to as 2.5 D integrated circuits.

Device 10 may include input-output circuitry 12 that interfaces between device 10 and memory module 22. Input-output circuitry 12 may include memory controller circuitry 28 and memory calibration circuitry 30. For example, input-output circuitry 12 may include modular input-output circuits that each contain memory controller circuitry and are collectively configured to implement memory controller 28. Memory controller circuitry 28 may serve to relay information between memory module 22 and logic circuits 18 that are internal to device 10. Read/write data may be conveyed between memory controller circuitry 28 and programmable circuitry 18 via paths 40. Memory controller 28 may be configured to generate appropriate control signals corresponding to the memory protocol currently under use (e.g., circuit 28 may handle memory data management to address desired banks, rows, and columns and to perform memory refresh).

Input-output circuitry 12 may be coupled to memory module 22 through paths 34 and 36. During memory read operations, data (DQ) signals and data strobe (DQS) signals may be conveyed from memory module 22 to memory controller circuitry 28 over path 34. During memory write operations, DQ/DQS may be conveyed from memory interface circuit 26 to memory controller circuitry 28 over path 34. Calibration circuitry 30 may be used upon startup to perform calibration operations (e.g., for reducing skew caused by process variations).

During read and write operations, control signals such as clock CLK, address ADDR, and command CMD signals may be conveyed from memory controller circuitry 28 to memory module 22 over path 36. The timing of the control signals may be controlled by timing control circuitry within memory controller circuitry 28 of input-output circuitry 12.

Signal CLK may serve as a system reference clock (e.g., a reference clock to which the DQS signals, address signal ADDR, and command signal CMD should be aligned). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

The arrangement of FIG. 2 is merely illustrative and is not intended to limit the scope of the present invention. Integrated circuits other than programmable integrated circuits may similarly include input-output circuitry 12 having memory controller circuitry and/or calibration circuitry and is used to communicate with one or more memory modules 22.

Figure 3:
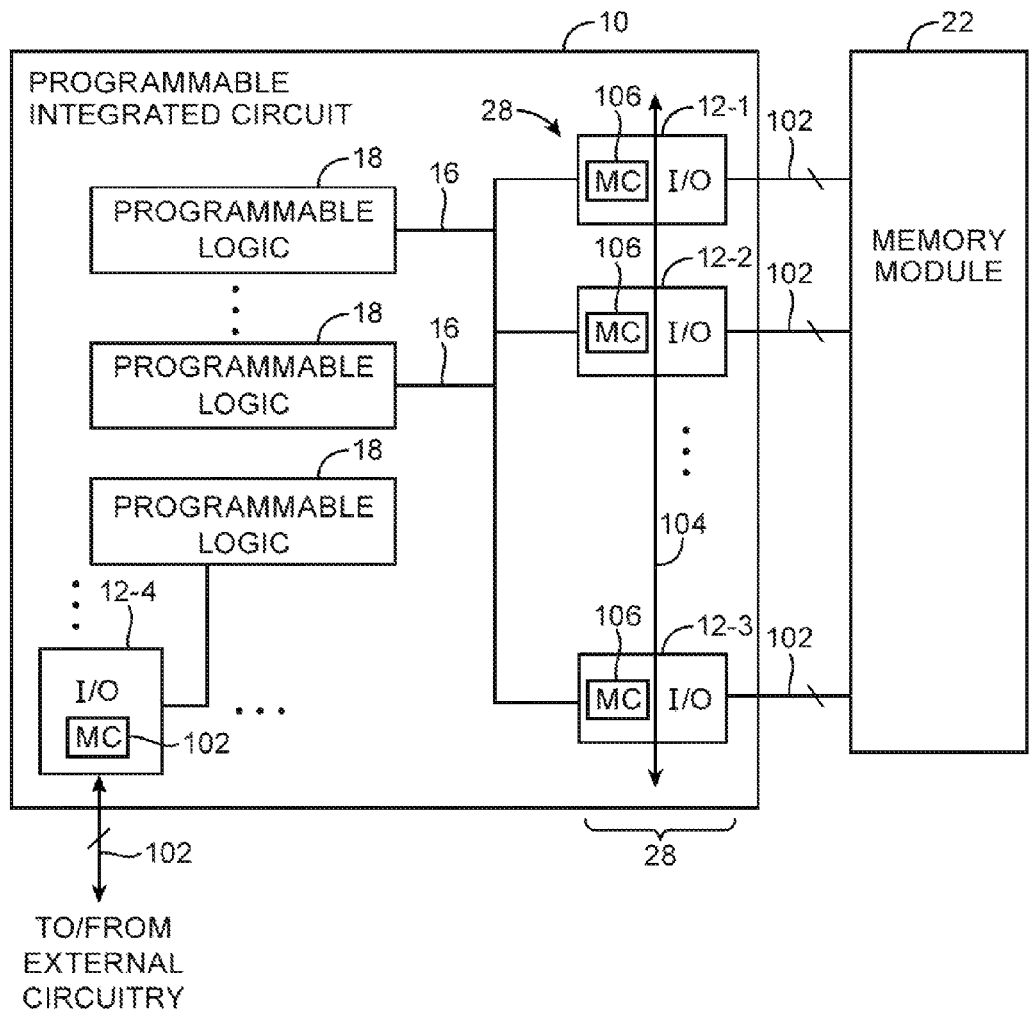
FIG. 3 is a diagram of an illustrative integrated circuit with input-output circuits having dedicated memory controller circuitry that may be used in communicating with external memory in accordance with an embodiment of the present invention.

Paths such as paths 40 of FIG. 2 that are used to route signals such as memory access requests between memory controller 28 and logic circuits 18 can occupy valuable circuit area on programmable integrated circuit 10. FIG. 3 is a diagram of a programmable integrated circuit 10 in which input-output circuits 12 are each provided with dedicated memory controller circuits 106. The modular distribution of memory controller circuitry within input-output circuits 12 may help to reduce area occupied by signal routing paths.

I/O circuits 12 may each handle a set of input-output signals between programmable integrated circuit 10 and external circuitry. I/O circuits 12 may be configured (e.g., programmed in a first configuration) to drive paths 102 with input-output signals provided by programmable logic 18 or may be configured to serve as modular memory controller circuit blocks (e.g., in a second configuration).

In the example of FIG. 3, I/O circuits 12-1, 12-2, and 12-3 are configured to interface between programmable integrated circuit 10 and memory module 22. The set of input-output signals for a given I/O circuit 12 may be conveyed to memory module 22 over a corresponding set of paths 102 (e.g., paths including input-output pins such as pins 14 of FIG. 1). Each set of paths 102 that couples a respective I/O circuit 12 to memory module 22 may have a bit width corresponding to the maximum bit width of input-output signals conveyed over that set of paths. As an example, each set of paths 102 may have a width of twelve bits. This example is merely illustrative, as each set of paths 102 may have any desired bit width (e.g., four bits, eight bits, nine bits, 12 bits, 16 bits, etc.).

Each of memory controller circuits 106 may be capable of handling memory controller operations for a corresponding set of control and/or data signals between programmable integrated circuit 10 and memory 22. Memory access signals provided by programmable logic 18 over programmable interconnects 16 may be partitioned among the input-output circuits that have been configured to serve as memory controller blocks. As an example, control signals may be provided to memory controller block 12-1, whereas write and read data signals may be conveyed over memory controller blocks 12-2 and 12-3. As another example, control signals may be provided to memory controller block 12-2, whereas data signals may be conveyed over memory controller blocks 12-1 and 12-3. These examples are merely illustrative. Any desired number of I/O circuits 12 may be configured as memory controller blocks (e.g., one, two, three, four, or more), and any desired portion of the configured memory controller blocks may be used in handling control or data signals. Memory controller blocks that are in use may collectively form a memory controller such as controller 28 of FIG. 2.

The number of memory controller blocks configured may be determined based on how many control and data signals are required (e.g., the width of data paths 102 coupled to the memory controller blocks may correspond to the width of the control and data signals). For example, a sufficient number of memory controller blocks may be configured to convey control signals such as address, command, and clock signals. Similarly, a sufficient number of memory controller blocks may be configured to handle data signals such as read and write signals.

I/O circuits 12 may be coupled by a control signal backbone path 104. Control signal path 104 may electrically couple a group of I/O circuits 12 that functions collectively as a memory controller. In the example of FIG. 3, control signal path 104 couples I/O circuits 12-1, 12-2, and 12-3 to form memory controller 28, whereas I/O circuit 12-4 remains isolated and therefore does not form part of memory controller 28. Control signals such as local or memory control signals may be conveyed between controller blocks using backbone path 104. Use of local backbone path 104 allows flexibility in routing signals from programmable logic 18 to I/O blocks 12 over interconnects 16, because it is not necessary to route control signals to each distributed memory controller block (e.g., thereby also reducing the number of interconnects 16 and associated circuit area that is needed to handle memory controller and I/O operations).

Multiple programmable logic regions 18 may be coupled to memory controller 28 via different or shared paths 16. For example, interconnects 16 may form a bus to which multiple programmable logic regions 18 are coupled. Each programmable logic region 18 may provide memory access requests to memory controller 28 over paths 16. If desired, only one programmable logic region 18 may be coupled to memory controller 28 via paths 16.

I/O circuits 12 may be configured based on desired functionality. In the example of FIG. 3, I/O circuit 12-4 is configured to interface between integrated circuit 10 and external circuitry. The external circuitry may include external communications circuitry, peripheral devices, or other external circuitry or devices. I/O circuit 12-4 may receive signals from a corresponding programmable logic region 18 and drive the signals onto paths 102. I/O circuit 12-4 may receive signals from the external circuitry and provide the received signals to the programmable logic region. In this scenario, memory controller circuitry 28 of I/O circuit 12-4 may remain unused, as I/O circuit 12-4 is not used to interface with external memory.

The example of FIG. 3 in which interconnect backbone 104 traverses I/O circuits 12-1, 12-2, and 12-3 is merely illustrative. If desired, interconnect backbone path 104 may traverse any desired number of I/O circuits 12. For example, backbone path 104 may traverse I/O block 12-4. Backbone path 104 may traverse some or all of I/O circuits 12 on programmable integrated circuit 10. If desired, groups of two or more I/O circuits 12 may be organized with a backbone path 104 traversing the I/O circuits of each group. Each backbone path 104 may be configured to electrically couple some or all of the I/O circuits that are traversed by that backbone path to form memory controllers. I/O circuits that are not coupled to other I/O circuits via a backbone path 104 may operate as independent memory controllers or may operate as a direct signal interface between on-chip logic such as logic regions 18 and off-chip circuitry (e.g., the I/O circuits may pass signals between the on-chip logic and the off-chip circuitry).

Figure 4:
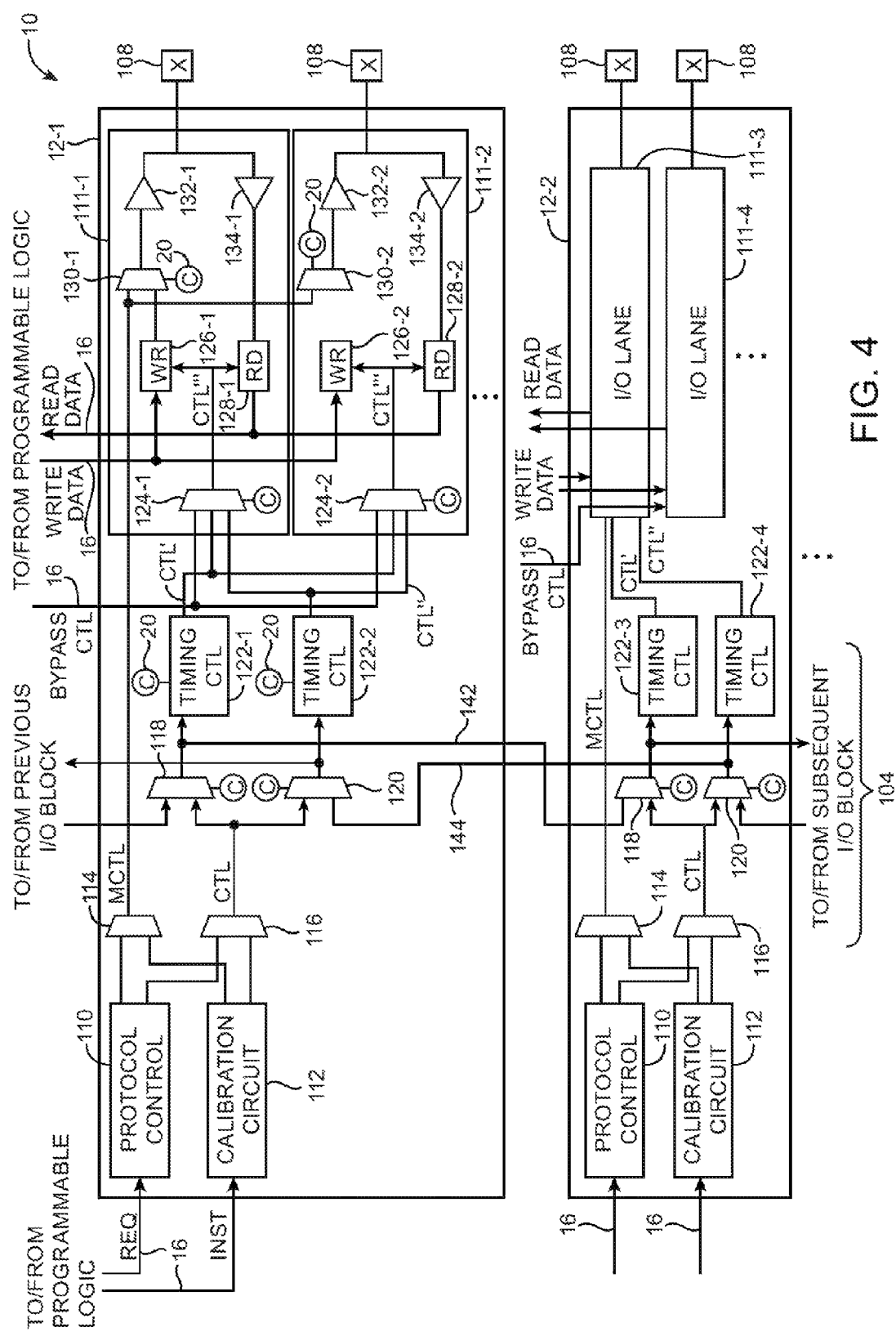
FIG. 4 is a diagram of illustrative input-output circuits having dedicated memory controller circuitry that are electrically coupled by a backbone path in accordance with an embodiment of the present invention.

FIG. 4 is an illustrative diagram of modular I/O circuits 12-1 and 12-2 of a programmable integrated circuit 10. As shown in FIG. 4, each I/O circuit 12 may include memory controller circuitry such as protocol control circuitry 110, calibration circuitry 112, and multiple I/O lanes 111 that may each include dedicated (non-programmable) logic.

I/O lanes 111 are each coupled to a corresponding set of I/O pins 108. Each set of I/O pins 108 includes one or more I/O pins (e.g., I/O pins 14 of FIG. 1). As an example, each I/O lane 111 may include a set of twelve I/O pins that may be coupled to external circuitry such as an external memory module. An I/O lane 111 may be referred to based on how many I/O pins are coupled to the I/O lane. For example, an I/O lane that is coupled to twelve I/O pins may be referred to as an x12 I/O lane.

Each I/O lane 111 may be configured or controlled based on a desired functionality. I/O lanes may be configured to pass data from programmable logic circuitry to I/O pins 108 or configured to pass control signals from protocol control circuitry 110 or calibration circuitry 112. I/O lanes 111 that are configured to pass control signals from protocol control circuitry 110 may sometimes be referred to herein as control lanes or I/O control lanes. I/O lanes 111 that are configured to pass memory write data or receive memory read data may sometimes be referred to as data lanes or I/O data lanes. I/O lanes 111 that are configured to drive I/O pins 108 with other signals received from circuitry on integrated circuit 10 may sometimes be referred to as pass-through lanes.

Each I/O lane 111 of a given I/O circuit 12 may be configured independently of other I/O lanes 111 of that given I/O circuit 12. For example, I/O lane 111-1 of I/O circuit 12-1 may be configured as a control lane, whereas I/O lane 111-2 may be configured as a data lane. As another example, I/O lanes 111-1 and 111-2 may each be configured as control lanes or data lanes.

In scenarios in which one or more lanes 111 of a I/O circuit 12 are configured as control lanes, protocol control circuitry 110 of the I/O circuit may receive memory access requests REQ over paths 16 (e.g., from programmable logic on the integrated circuit). The memory access requests may include read and write requests that identify corresponding memory addresses. Protocol control circuit 110 may process the received memory access requests and generate control signals. The control signals generated by protocol control circuit 110 may include memory control signals (MCTL) such as address (ADR), row access strobe (RAS), column access strobe (CAS), chip select (CS), or other memory control signals that are provided to external memory. The control signals may include local control signals (CTL) that are used to control the operations of I/O lanes 111.

Memory control signals may be conveyed from protocol control circuit 110 to I/O pins 108 via multiplexers 114 and 130-1. Multiplexer 114 may be configured (e.g., via a corresponding programmable element) or controlled (e.g., via control signals provided by calibration circuit 112) to select memory control signals MCTL provided by protocol control circuit 110 and route the selected signals to multiplexers 130. Similarly, multiplexers 130 may be configured to select and route the control signals from multiplexers 114 to driver circuitry 132-1. Configuration of I/O lanes 111 refers to the configuration of multiplexers 130 to select either control signals provided by protocol control 110 (e.g., a first configuration) or select control signals provided by dedicated, non-programmable data buffer circuitry (e.g., a second configuration). Each multiplexer 130 may receive only a portion of control signals MCTL. For example, multiplexer 130-1 may receive and select a first subset of control signals MCTL whereas multiplexer 130-2 may select a second subset of control signals MCTL. The number of control signals received by each multiplexer 130 may depend on the number of corresponding I/O pins 108 that are coupled to that multiplexer 130. Driver circuitry 132-1 may be used to drive the corresponding I/O pins 108 with the selected signals.

I/O blocks 12 may be electrically coupled via a backbone control signal path 104. Backbone path 104 may include multiplexers 118 and 120 for each I/O circuit 12 and may include local interconnects such as interconnects 142 and 144 that electrically couple different I/O circuits. Backbone path 104 may traverse multiple I/O circuits 12 and may be configured or controlled to pass control signals to the I/O circuits. Multiplexers of backbone path 104 may be configured via programmable elements or controlled via control signals provided by calibration circuit 112 or protocol control 110. Local control signals that are generated by a protocol control circuit 110 of a given I/O circuit 12 may be routed by backbone path 104 to I/O lanes 111 of other I/O circuits that are coupled to backbone path 104.

Backbone path 104 accommodates combining of modular I/O circuits 12 without additional routing paths for control signals from core logic such as programmable logic regions 18 to I/O circuits 12. Memory access requests may be provided to only one (or a subset, if desired) of I/O circuits 12 using global interconnects. The memory access requests may be processed using the protocol control circuit 110 of that I/O circuit and local control signals may be subsequently forwarded to other I/O circuits 12 via local interconnects of backbone path 104. By routing the local control signals to other I/O circuits 12 using backbone path 104, fewer global interconnects may be used for memory controller operations (e.g., which allows the global interconnects to be used for other functionality or accommodates a reduction in the overall die area and/or cost of integrated circuit 10).

Backbone path 104 may introduce delays when passing local control signals between different I/O circuits 12. For example, local control signals (CTL) that are passed from I/O circuit 12-1 to I/O circuit 12-2 may be delayed from traversing local interconnect 142 and multiplexer 118. To accommodate and compensate for relative delays in local control signals between different I/O circuits, each I/O circuit 12 may be provided with timing control circuitry 122. In the example of FIG. 4, I/O circuit 12-1 may be provided with timing control circuits 122-1 and 122-2, whereas I/O circuit 12-2 may be provided with timing control circuits 122-3 and 122-4. Each timing control circuit may serve to compensate for relative delays between a control signal source (e.g., a protocol control circuit 110 that generates local control signals)

and control signal destinations (e.g., I/O lanes 111 that receive the local control signals).

Consider the scenario in which I/O lane 111-1 is configured as a control lane and I/O lanes 111-2, 111-3, and 111-4 are configured as data lanes. In this scenario, I/O circuit 12-1 is selected to handle memory access requests, because I/O circuit 12-1 includes a control lane. Protocol control circuit 110 of I/O circuit 12-1 may receive and process the memory access requests to generate memory control signals MCTL and local control signals CTL. The memory control signals may be provided to external memory via control lane 111-1. Backbone path 104 may route local control signals CTL to data lanes 111-2, 111-3, and 111-4 of I/O circuits 12-1 and 12-2. Timing control circuits 122-2, 122-3, and 122-4 may be configured to delay local control signals CTL so that local control signals CTL are synchronized across the data lanes. For example, timing control circuit 122-3 may delay local control signals CTL received from I/O circuit 12-1 by an amount representative of the delay incurred by interconnect path 142 to synchronize control signals CTL between I/O circuits 12-1 and 12-2.

Each I/O lane 111 may include a write buffer 126 and a read buffer 128. A multiplexing circuit 124 may select control signals to provide to the write and read buffers. Multiplexing circuit 124 may receive local control signals CTL' and CTL" from timing control circuits and/or bypass control signals from programmable logic. For example, multiplexing circuit 124 may select control signal CTL'" from control signals CTL', CTL", and bypass control signals and provide control signal CTL'" to the buffer circuitry. Control signals CTL'" may control the operations of write and read buffers to satisfy memory timing requirements such as column access or row access latencies.

Write buffers 126 may be formed from storage circuitry such as a first-in-first-out (FIFO) buffer or a circular buffer. Control signals CTL'" provided to write buffers 126 may direct the write buffers to store (e.g., push) write data received over paths 16 or may direct the write buffers to update the data driven onto I/O pins 108 (e.g., pop). If desired, control signals CTL'" may specify a specific storage location within the write buffers to which write data should be written or from which data should be provided to I/O pins 108. For example, control signals CTL'" provided to write buffer 126-1 may instruct write buffer 126-1 to write data received over paths 16 and may specify a pointer for write buffer 126-1 (i.e., an address referencing a specific location within all possible storage locations of write buffer 126-1). In this scenario, write buffer 126-1 may store the write data at the storage location specified by the pointer.

Read buffers 128 may be formed from storage circuitry similarly to write buffers 126. Read buffers 128 may be controlled via control signals CTL'" to store data received from external memory or to update data provided to programmable logic over paths 16. The timing of control signals CTL'" may be determined by protocol control circuit 110 and timing control circuits 122 based on timing requirements associated with the currently used memory protocol or by characteristics of external memory. For example, control signals CTL'" may instruct read buffer 126-2 to store read data received from external memory over I/O pins 108 during a valid data window defined by the currently used memory protocol, the performance characteristics of the external memory (e.g., latency characteristics such as RAS or CAS latency), and/or other factors such as latency from board traces, buffer circuitry, etc.

Multiplexers 130 of each I/O lane 111 may be coupled to I/O pins 108 via driver circuits 132. Driver circuits 132 may be configured to drive I/O pins 108 with signals selected by multiplexers 130. Multiplexers 130 may be configured via programmable elements 20 to select between memory control signals MCTL (e.g., generated by protocol control circuit 110 or calibration circuit 112) and write data (e.g., provided by write buffer 126). As an example, I/O lane 111-1 may be configured as a control lane by loading configuration data into programmable elements 20 that configures multiplexer 130-1 to select and provide memory control signals MCTL from protocol control circuit 110 to I/O pins 108. As another example, I/O lane 111-1 may be configured as a data lane by loading configuration data that configures multiplexer 130-1 to select data from write buffer 126-1.

In some scenarios, it may be desirable to use a separate memory controller in communicating with external memory. For example, a separate memory controller may be implemented using programmable logic on device 10 (e.g., a soft memory controller). In this scenario, the separate memory controller may provide added functionality and flexibility (e.g., in accommodating memory modules that are potentially incompatible with the dedicated memory circuitry of I/O circuits 12. For example, external memory having protocol requirements that are not handled by protocol control 110 may be handled using separate memory controller circuitry. Communications using a separate memory controller may be accommodated using dedicated bypass paths within paths 16.

During bypass operations, control signals CTL'" for write and read data buffers may be routed to write and read data buffers 126 and 128 from separate memory controller circuitry by configuring multiplexers 124. Memory control signals (e.g., RAS, CAS, etc.) may be received from the separate memory controller circuitry and stored by write buffers 126 over paths 16. The memory control signals may be received over paths 16 that are normally used during memory controller operations to convey write data from programmable logic to write buffer 126-1. Using bypass configurations of I/O lanes 111, I/O circuits 12 may accommodate use of a separate memory controller to control memory accesses.

It is often desirable to perform calibration operations prior to normal memory controller operations (e.g., prior to processing memory access requests from programmable logic). For example, each different external memory module may have potentially different timing characteristics and requirements. As another example, variances due to manufacturing tolerances may produce circuitry and interconnect paths associated with different amounts of signal delay. As another example, traces on a printed circuit board may be designed with different delays. Calibration operations may be performed to synchronize control and data signals for interfacing with a given external memory module. For example, calibration operations may be performed to align DQ and DQS signals. Modular I/O circuits 12 may each include calibration circuitry 112 that performs calibration operations.

Calibration circuitry 112 may receive test instructions INST over paths 16. Test instructions INST may be received from a dedicated processor (e.g., a general purpose processor), from programmable logic, or from other circuitry on device 10. Calibration circuitry 112 may process the test instructions to produce a sequence of test memory accesses corresponding to the test instructions. The sequence of test memory accesses may include read accesses, write accesses, and commands that configure the memory interface. For example, the sequence may include write accesses that write test data into external memory and read accesses that read the test data from the external memory. Each test memory access may be used by calibration circuit 112 in producing corresponding control signals CTL. During calibration operations, multiplexers 114 and 116 may be controlled to select and route control and data signals from calibration circuit 112 to I/O circuits 111. Memory control and data signals may be produced by calibration circuit 112 and routed directly to corresponding I/O pins 108 using multiplexers 114 and 130. For example, test data signals may be routed from calibration circuit 112 to a first portion of I/O pins 108 via multiplexers 116 and 130-1, whereas memory control signals may be routed from calibration circuit 112 to a second portion of I/O pins via multiplexers 116 and 130-2.

Test results such as whether or not data was written and subsequently read correctly for a particular set of control signals and settings may be used in calibrating I/O circuit 12 for communicating with the external memory. For example, calibration circuit 112 or a separate processor may process the test results to determine which set of control settings should be used by protocol control circuit 110 and timing control circuits 122 during normal memory access operations.

If desired, calibration circuit 112 may receive a sequence of test memory accesses via interconnects 16 (e.g., from a calibration processor, general purpose processor, or programmable logic). Such as scenario may help to reduce the complexity of calibration circuit 112, as it is no longer required to locally map instructions to sequences of test memory accesses.

The example of FIG. 4 in which protocol control 110 and calibration circuit 112 are formed as separate circuits is merely illustrative. If desired, protocol control 110 and calibration 112 may be implemented in a single protocol control and calibration circuit block. In this scenario, memory access requests REQ and test instructions INST may optionally be received over the same set of interconnects 16 (e.g., because memory access requests are received during normal memory access operations, whereas test instructions are received during test operations).

Figure 5:
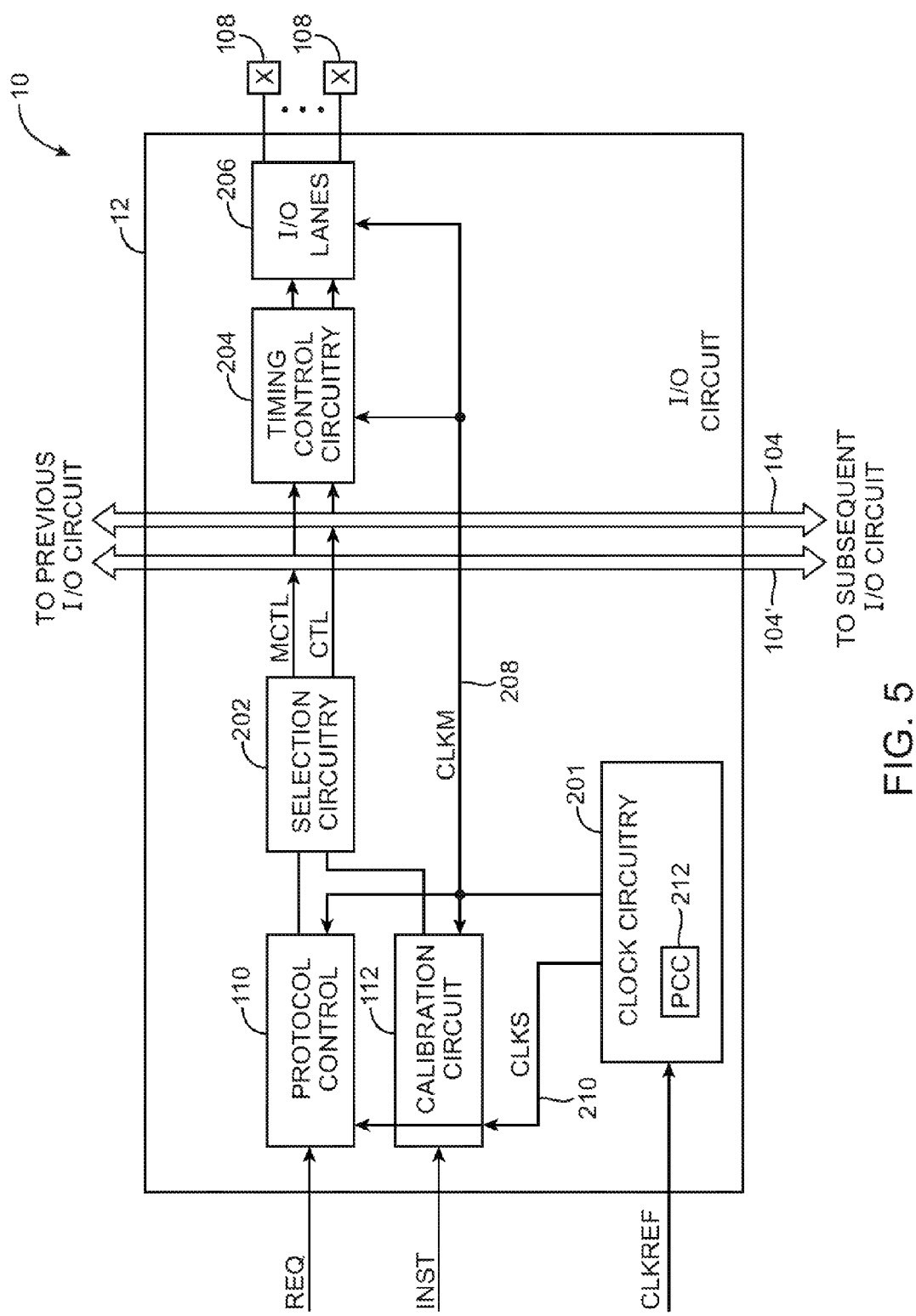
FIG. 5 is a diagram of an illustrative input-output circuit having dedicated memory controller circuitry that operates using clock signals produced by local clock circuitry in accordance with an embodiment of the present invention.

Dedicated protocol control and buffer circuitry may allow the memory controller to operate at clock frequencies that are equivalent or comparable to the operational frequencies of external memory. Therefore, it may no longer be necessary to utilize clock conversion circuitry such as half or quarter rate frequency conversion circuitry. FIG. 5 is an illustrative diagram of an I/O circuit 12 that is provided with local clock circuitry 201 that generates clock signals for I/O circuit 12. I/O circuit may include protocol control circuit 110, calibration circuit 112, selection circuitry 202, timing control circuitry 204, and I/O lanes 206. Selection circuitry 202 may include multiplexers such as multiplexers 114 and 116 of FIG. 4 that select between control signals provided by protocol control circuit 110 and calibration circuit 112. Timing control circuitry 204 may include timing control circuits such as timing control circuits 122 of FIG. 4. I/O lanes 206 may include two or more I/O lanes 111.

Local clock circuitry 201 may produce system clock signal CLKS and memory clock signal CLKM. Local clock circuitry 201 may include clock generation circuitry such as phase locked loop (PLL) circuitry 212 that receives one or more reference clock signals CLKREF at inputs and generates system clock signal CLKS and memory clock signal CLKM. By providing each I/O block circuit 12 with local clock generation circuitry that generates clock signals CLKS and CLKM from a reference clock signal, jitter on the clock signals may be reduced (e.g., compared to scenarios in which clock signals CLKM and CLKR are generated at central clock generation circuitry on device 10 and subsequently routed to I/O circuits 12 using global interconnects such as interconnects 16).

Memory clock signal CLKM may be routed throughout I/O circuit 12 via local paths 208 (e.g., to protocol control circuit 110, calibration circuit 112, timing control circuitry 204, and I/O lanes 206). I/O lanes 206 may provide memory clock signal CLKM to external memory via an I/O pin 108. System clock signal CLKS may be routed to circuitry that interfaces with other circuitry on device 10 (e.g., to protocol control circuit 110 and calibration circuit 112).

Memory clock signal CLKM may operate at relatively high frequencies such as 400 MHz, 800 MHz, or 1 GHz for interfacing with external memory. For example, write and read buffers within I/O lanes 206 may store and update data based on memory clock signal CLKM (e.g., at the rising edge of memory clock signal CLKM). I/O circuit 12 may be capable of operating at such high frequencies because memory controller circuitry such as write and read buffers within I/O circuit 12 is formed from dedicated (i.e., non-programmable) circuitry.

System clock signal CLKS may operate at relatively low frequencies such as 100 MHz, 125 MHz, etc. (e.g., lower than the operating frequency of memory clock signal CLKM). Protocol control circuitry 110 and calibration circuit 112 may control the operation of I/O circuit 12 to interface between the lower speed clock domain of other circuitry such as programmable logic and the higher speed clock domain of I/O circuit 12 and external memory. For example, protocol control circuit 110 may generate local control signals CTL that direct write and read buffers of I/O lanes 206 to store write data and provide read data using memory clock signal CLKM while aligning the local control signals with system clock signal CLKS.

If desired, one or more memory control signals (i.e., memory control signals such as MCTL to be conveyed to external memory) may be conveyed between I/O circuits 12 using backbone path 104'. Backbone path 104' may be implemented similarly to backbone path 104. For example, backbone path 104' may include multiplexers 118 and 120 that receive memory control signals from the current I/O circuit 12 and adjacent (e.g., previous and subsequent) I/O circuits 12 and select which memory control signals to provide to I/O lanes 206. Only a subset of the memory control signals such as a chip select signal may be conveyed by backbone path 104' (as an example).

Figure 6:
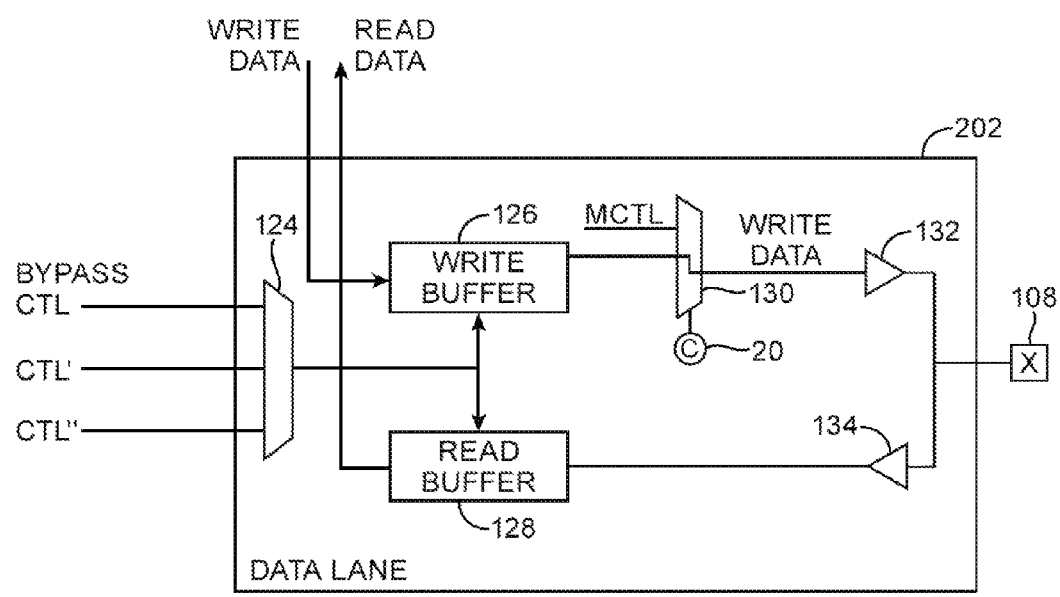
FIG. 6 is a diagram of an illustrative input-output lane that is configured as a data lane and may form a portion of an input-output circuit in accordance with an embodiment of the present invention.

The example of FIGS. 5 and 6 in which backbone paths 104 and 104' electrically couple adjacent I/O circuits is merely illustrative. If desired, backbone paths 104 and 104' may convey control signals between any set or subset of I/O circuits (e.g., control signals may traverse only a subset of I/O circuits and may bypass one or more selected I/O circuits).

FIG. 6 is an illustrative diagram of a data lane (e.g., an I/O lane 111 such as I/O lane 111 of FIG. 4 that is configured to convey and/or receive data signals from external memory). As shown in FIG. 6, multiplexer 130 may be configured via programmable element 20 to couple write buffer 126 to I/O pins 108. Data stored in write buffer 126 may be driven onto I/O pins 108 using driver circuit 132 and provided to external memory. Signals MCTL received from a protocol control circuit or a calibration circuit are not selected. This example is merely illustrative. If desired, multiplexer 130 may be controlled to serve as a data lane by a control signal provided by calibration control circuit 112 or protocol control circuit 110.

Figure 7:
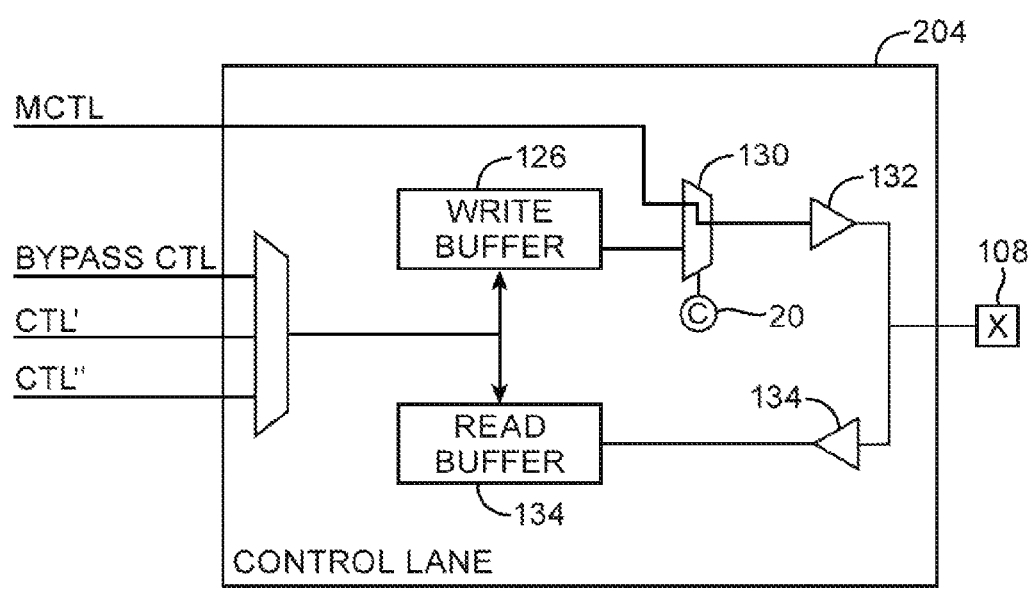
FIG. 7 is a diagram of an illustrative input-output lane that is configured as a control lane and may form a portion of an input-output circuit in accordance with an embodiment of the present invention.

FIG. 7 is an illustrative diagram of an I/O lane such as I/O lane 111 of FIG. 4 that is configured as a control lane 204. As shown in FIG. 7, multiplexer 130 of control lane 204 is configured via programmable element 20 to select and route memory control signals MCTL to I/O pins 108. Data from write buffer 126 is not selected by multiplexer 130. This example is merely illustrative and multiplexer 130 may be controlled to serve as a control lane using a control signal provided by calibration control circuit 112 or protocol control circuit 110.

Figure 8:
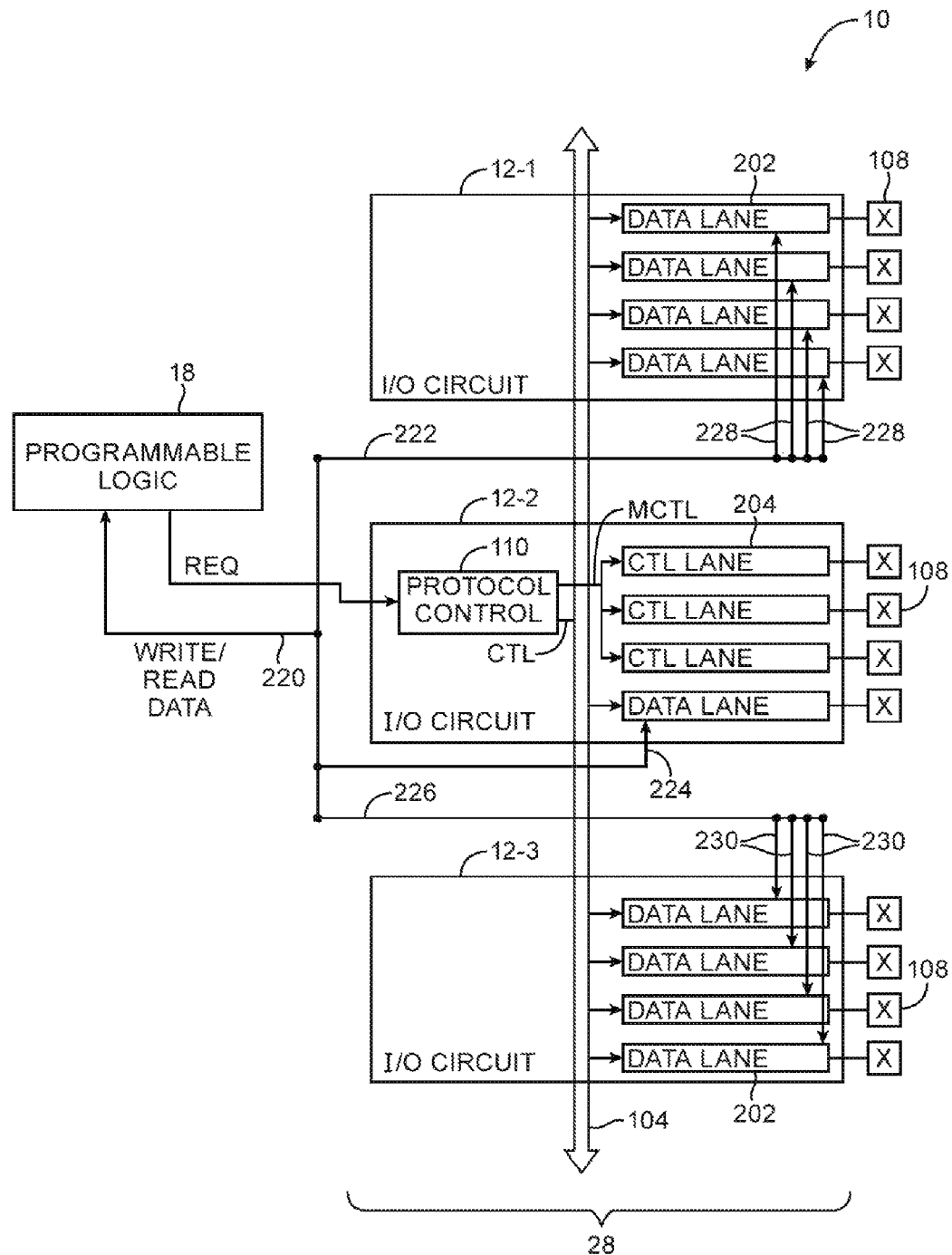
FIG. 8 is a diagram showing how input-output circuits may be configured with control and data lanes that collectively implement a memory controller in accordance with an embodiment of the present invention.

FIG. 8 is an illustrative diagram of device 10 in which multiple I/O circuits 12 are configured to collectively implement a memory controller 28. Memory controller 28 may include I/O circuits 12-1, 12-2, and 12-3 that are coupled via backbone path 104. In the example of FIG. 8, each I/O circuit 12 includes four I/O lanes that are coupled to corresponding I/O pins 108 (e.g., each I/O lane is coupled to a respective set of one or more I/O pins 108). In the example of FIG. 8, I/O circuit 12-2 is selected for control operations and three I/O lanes of I/O circuit 12-2 are configured as control lanes 204, whereas the remaining I/O lanes of selected I/O circuit 12-2 and unselected I/O circuits 12-1 and 12-3 are configured as data lanes 202. This example is merely illustrative, and each I/O circuit 12 may be provided with any desired number of I/O lanes.

Memory access requests REQ provided by programmable logic 18 may be received at protocol control 110 of I/O circuit 12-2. Protocol control circuit 110 may process the memory access requests and generate memory control signals MCTL and local control signals CTL. Memory control signals MCTL may be partitioned and passed to control lanes 204 of I/O circuit 12-2. For example, in the scenario that each I/O lane is coupled to a set of 12 I/O pins 108 and can handle 12 signals between device 10 and external memory, up to 12 memory control signals may be conveyed by each control lane 204 to external memory (e.g., up to 36 total control signals such as address, RAS, CAS, chip select, etc.). Backbone path 104 may pass local control signals CTL to each data lane of memory controller 28. It is not necessary for memory requests REQ to be provided to unselected I/O circuits 12-1 and 12-3, because I/O circuits 12-1 and 12-3 do not include any control lanes and are not used in conveying memory control signals to external memory. Protocol control circuits of unselected I/O circuits 12-1 and 12-3 may therefore remain unused.

Data signals such as read and write data may be conveyed between programmable logic 18 and data lanes 202 over interconnect paths. The data signals from each data lane may be aggregated when provided to programmable logic 18. Similarly, the data signals provided by programmable logic 18 may be partitioned when conveyed to the data lanes. Local control signals CTL may ensure that data lanes 202 are synchronized when conveying data between programmable logic 18 and external memory.

As an example, write data signals provided by programmable logic 18 may have a bit width of 72 bits. In this scenario, the write data may be partitioned into 8-bit groups that are each conveyed to a respective data lane 202. Interconnects 220 may have a width of 72 bits. Interconnects 222 may have a width of 32 bits (e.g., to convey four groups each having eight bits) and interconnects 228 may each have a width of eight bits. Similarly, interconnects 226 and 230 may have respective widths of 32 bits and 8 bits to convey the write data signals to data lanes 202 of I/O circuit 12-3. Interconnects 224 may have a width of eight bits, as I/O circuit 222 includes only one data lane 202. This example is merely illustrative. If desired, additional signals such as data mask signals may be conveyed using additional interconnects (e.g., one or two data mask signals provided on respective interconnects for each data lane 202).

The number of I/O lanes configured may be determined based on the bit width of data and control signals passed between device 10 and external memory and the number of I/O pins 108 coupled to each I/O lane (e.g., the number of signals that each I/O lane is capable of conveying between device 10 and external memory). For example, to handle read data signals of increased bit width from external memory, unused I/O lanes may be configured as data lanes. If all I/O lanes in currently used I/O circuits 12 are in use, I/O lanes of additional I/O circuits 12 may be configured and backbone path 104 may be configured or controlled to pass local control signals to the additional I/O lanes.

Figure 9:
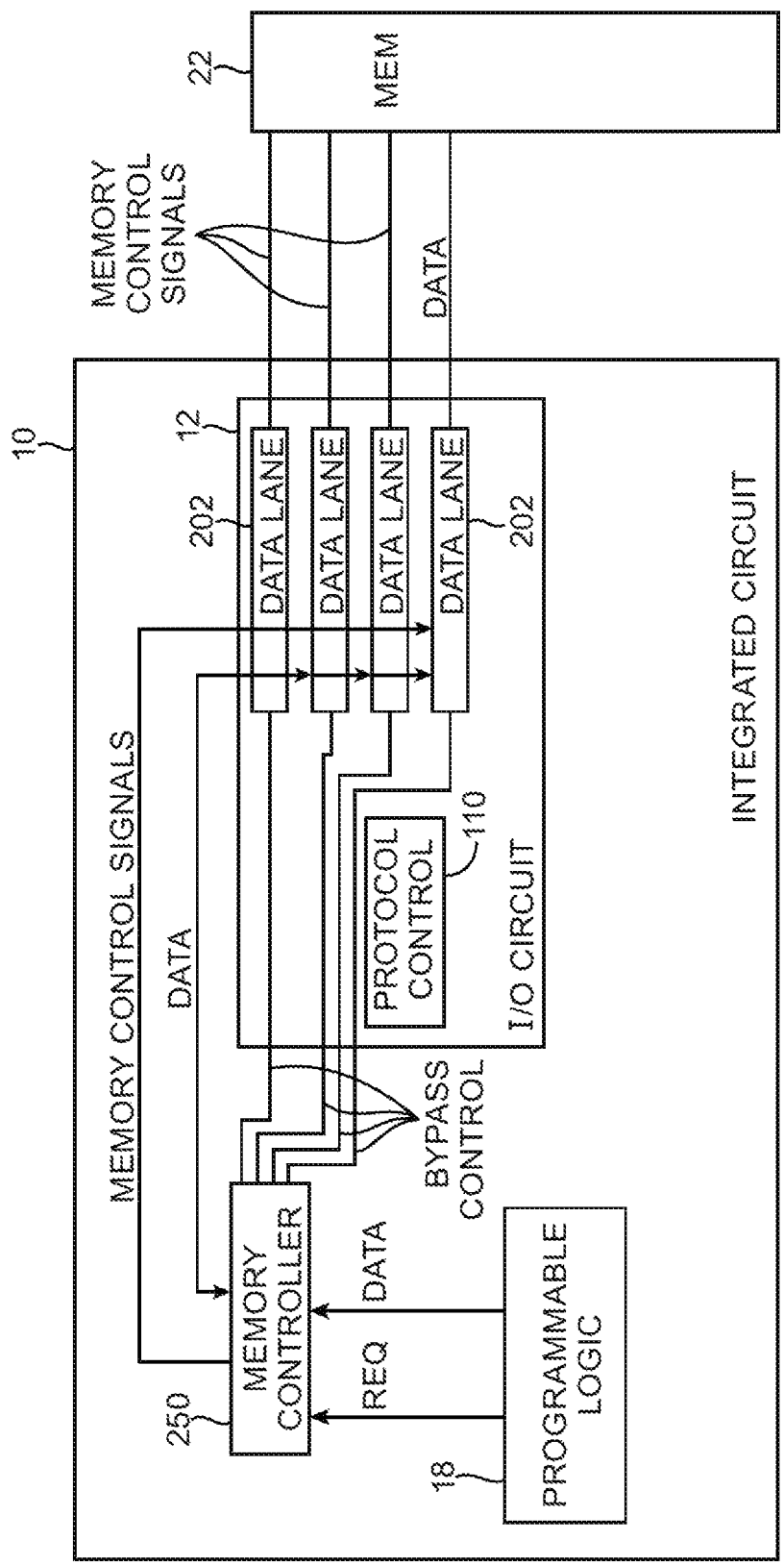
FIG. 9 is a diagram showing how dedicated memory controller circuitry of an input-output circuit may be bypassed to use a separate memory controller in accordance with an embodiment of the present invention.

I/O circuits 12 may accommodate use of a separate memory controller for added flexibility in interfacing with different external memory modules. FIG. 9 is a diagram of an illustrative device 10 in which I/O circuits 12 are configured in a bypass mode in which protocol control circuitry 110 in I/O circuit 12 is bypassed. In the bypass configuration, I/O lanes of I/O circuit 12 are configured as data lanes 202 that are controlled by bypass control signals from memory controller 250. Memory controller 250 of FIG. 9 may be implemented using programmable logic of device 10 and therefore provide additional flexibility in interfacing with different external memory modules. Memory access requests REQ and data from programmable logic 18 may be routed to memory controller 250. Memory controller 250 may process the memory access request and produce memory control signals that are provided to a first subset of the data lanes 202. The memory control signals may be stored at write buffers of data lanes 202 and provided to external memory 22 as controlled by the bypass control signals. The data signals may be provided to a second subset of the data lanes and conveyed to external memory as controlled by the bypass control signals from memory controller 250.

Figure 10:
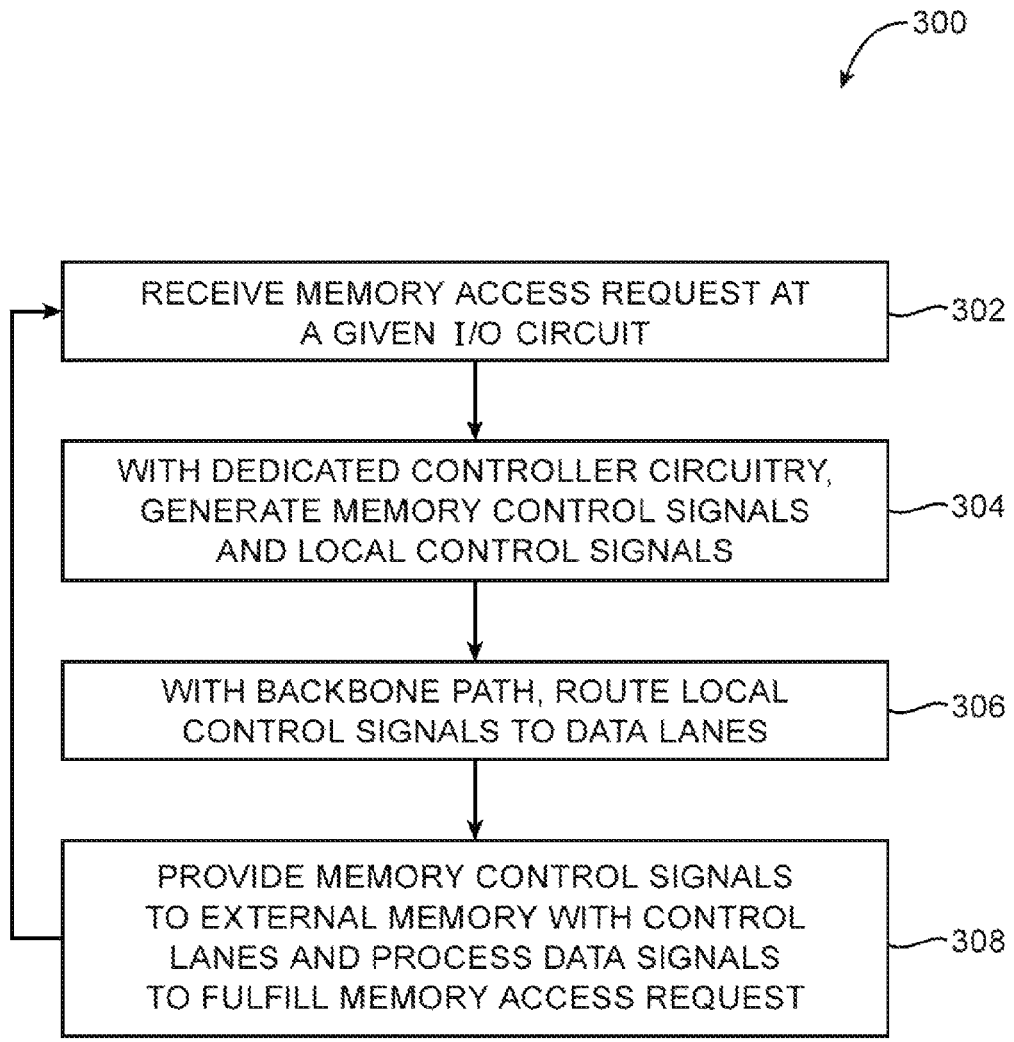
FIG. 10 is a flow chart of illustrative steps that may be performed to fulfill memory access requests using modular input-output circuits that are configured to collectively implement a memory controller in accordance with an embodiment of the present invention.

FIG. 10 is a flow chart 300 of illustrative steps that may be performed by I/O circuits having dedicated memory controller circuitry to fulfill memory access requests. The operations of FIG. 10 may, for example, be performed by modular I/O circuits 12 of FIG. 3 that have been configured to collectively implement a memory controller that interfaces with external memory.

During step 302, a given, selected I/O circuit may receive a memory access request. The memory access request may be received from programmable logic or other circuitry requiring access to memory such as dedicated circuitry, general-purpose processing circuitry, etc. The given I/O circuit may be an I/O circuit such as I/O circuit 12-2 of FIG. 8 that provides memory control signals to external memory.

During step 304, dedicated controller circuitry such as a protocol control circuit within the given I/O circuit may generate memory control signals and local control signals based on the memory access request. For example, protocol control circuit 110 of FIG. 8 may generate memory control signals MCTL that are provided to control lanes within the given I/O circuit and generate local control signals CTL for controlling data lanes.

During step 306, a backbone path such as backbone path 104 of FIG. 8 may be used to route the local control signals to data lanes that are coupled to the external memory. The data lanes may include data lanes within the given I/O circuit and data lanes of additional I/O circuits that are coupled to the backbone path.

During step 308, the I/O circuits may provide the memory control signals to the external memory and process data signals in fulfilling the memory access request. For example, a read access request may be fulfilled by providing address and other control signals to the external memory while the local control signals control read buffers in the data lanes to capture read data provided by the external memory. As another example, a write access request may be fulfilled by providing memory control signals to the external memory using control lanes while controlling data lanes with the local control signals to also provide write data to the external memory.

At the completion of step 308, the process may return to step 302 to process additional control signals. The example of FIG. 10 in which memory access requests are processed in sequence is merely illustrative. If desired, multiple memory access requests from one or more sources may be received and processed in any desired sequence. For example, protocol control circuitry may schedule and fulfill memory access requests in order of priority.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
    first and second input-output circuits each including respective memory controller circuitry; and
    a backbone path that electrically couples the memory controller circuitry of the first and second input-output circuits, wherein the first and second input-output circuits each include a multiplexing circuit interposed in the backbone path.

2. The integrated circuit defined in claim 1 wherein the integrated circuit communicates with external memory, the integrated circuit further comprising:
    circuitry that generates memory access requests; and
    interconnects that convey the memory access requests to a selected input-output circuit of the first and second input-output circuits.

3. The integrated circuit defined in claim 2 wherein the circuitry comprises programmable logic circuitry, wherein each memory controller circuitry of the first and second input-output circuits comprises dedicated memory controller circuitry.

4. The integrated circuit defined in claim 2 wherein each memory controller circuitry of the first and second input-output circuits comprises a protocol control circuit and wherein the protocol control circuit of the selected input-output circuit receives the memory access request, generates memory control signals, and provides the memory control signals to the external memory.

5. The integrated circuit defined in claim 4 further comprising:
    a plurality of input-output pins, wherein each of the first and second input-output circuits further comprises a plurality of input-output lanes each coupled to a respective subset of the plurality of input-output pins.

6. The integrated circuit defined in claim 5 wherein at least one of the plurality of input-output lanes of the selected input-output circuit is configured as a control lane that receives the memory control signals and provides the memory control signals to the external memory through the subset of input-output pins that are coupled to the control lane.

7. The integrated circuit defined in claim 6 wherein at least one of the plurality of input-output lanes of a non-selected input-output circuit is configured as a data lane that conveys data between the circuitry and the external memory, wherein the protocol control circuit generates a local control signal that is routed to the data lane using the backbone path.

8. The integrated circuit defined in claim 7 further comprising:
    a timing control circuit interposed between the backbone path and the data lane, wherein the timing control circuit compensates for signal delay associated with the backbone path.

9. The integrated circuit defined in claim 7 wherein each of the plurality of input-output lanes of the first and second input-output circuits comprise data buffer circuitry that is controlled by the local control signal.

10. The integrated circuit defined in claim 9 wherein the data buffer circuitry of each input-output lane comprises:
    a write buffer circuit for write data to the external memory; and
    a read buffer circuit for read data from the external memory.

11. The integrated circuit defined in claim 2 wherein the first and second input-output circuits each comprise a memory calibration circuit that performs memory calibration tests on the respective memory controller circuitry.

12. A programmable integrated circuit that communicates with external memory, the programmable integrated circuit comprising:
    a programmable logic region;
    a plurality of input-output pins; and
    a plurality of input-output circuits each including dedicated memory controller circuitry, wherein the plurality of input-output circuits collectively interface between the programmable logic region and the external memory, and wherein the dedicated memory controller circuitry of each input-output circuit comprises:
        a plurality of input-output lanes each coupled to a respective portion of the plurality of input-output pins, wherein each input-output lane has a first configuration in which the input-output lane forms a data lane that conveys data signals between the programmable logic region and the external memory and a second configuration in which the input-output lane forms a control lane that provides memory control signals to the external memory.

13. The programmable integrated circuit defined in claim 12 wherein the programmable logic region provides memory access requests to a selected one of the plurality of input-output circuits and wherein the dedicated memory controller circuitry of each input-output circuit further comprises:
    a protocol control circuit, wherein the protocol control circuit of the selected input-output circuit receives the memory access requests and generates memory control signals and wherein the protocol control circuits of non-selected input-output circuits are unused.

14. The programmable integrated circuit defined in claim 13 wherein the protocol control circuit of the selected input-output circuit generates local control signals, wherein a portion of the input-output lanes are configured in the second configuration as data lanes, the programmable integrated circuit further comprising:
    a backbone path that traverses the plurality of input-output circuits and routes the local control signals to each of the data lanes.

15. A method of operating an integrated circuit having circuitry that communicates with external memory, the method comprising:
    with an input-output circuit, receiving a memory access request from the circuitry;
    with dedicated controller circuitry within the input-output circuit, generating local control signals based on the memory access request;
    with a backbone path, routing the local control signals to at least one additional input-output circuit, wherein the input-output circuit and the additional input-output circuit each comprise control lanes and data lanes; and
with the control lanes, conveying memory control signals to the external memory.

16. The method defined in claim 15 further comprising:
with the dedicated controller circuitry within the input-output circuit, generating the memory control signals based on the memory access request.

17. The method defined in claim 15 further comprising:
with the data lanes, conveying data signals between the circuitry and the external memory based on the local control signals.

18. The method defined in claim 15 wherein each input-output circuit further comprises a timing control circuit interposed between the backbone path and the input-output lanes of that input-output circuit, the method further comprising:
with the timing control circuits, synchronizing the local control signals.

\* \* \* \* \*